(12) United States Patent
Gawde et al.

(10) Patent No.: US 10,552,260 B2
(45) Date of Patent: Feb. 4, 2020

(54) DETECTION OF DOUBLE BIT ERRORS AND CORRECTION OF SINGLE BIT ERRORS IN A MULTIWORD ARRAY

(71) Applicant: Cirrus Logic International Semiconductor Ltd., Edinburgh (GB)

(72) Inventors: Rahul Gawde, Lakeway, TX (US); Michael A. Kost, Cedar Park, TX (US); Alvin C. Storvik, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 90 days.

(21) Appl. No.: 15/984,108

(22) Filed: May 18, 2018

(65) Prior Publication Data
US 2018/0357124 A1    Dec. 13, 2018

Related U.S. Application Data

(60) Provisional application No. 62/518,156, filed on Jun. 12, 2017.

(51) Int. Cl.
| | |
|---|---|
| *G06F 11/10* | (2006.01) |
| *H03M 13/15* | (2006.01) |
| *G11C 29/52* | (2006.01) |
| *H03M 13/19* | (2006.01) |
| *H03M 13/29* | (2006.01) |

(52) U.S. Cl.
CPC ...... *G06F 11/1068* (2013.01); *G06F 11/1012* (2013.01); *G11C 29/52* (2013.01); *H03M 13/1575* (2013.01); *H03M 13/19* (2013.01); *H03M 13/2906* (2013.01); *H03M 13/2942* (2013.01); *H03M 13/2948* (2013.01)

(58) Field of Classification Search
CPC .. G06F 11/1068; G06F 11/1012; G11C 29/52; H03M 13/1575; H03M 13/19; H03M 13/2906; H03M 13/2942; H03M 13/2948
USPC ............... 714/764, 766, 768, 773, 781, 785
See application file for complete search history.

(56) References Cited

U.S. PATENT DOCUMENTS

| | | | | |
|---|---|---|---|---|
| 5,745,508 A | * | 4/1998 | Prohofsky | G06F 11/1028 714/766 |
| 6,823,487 B1 | * | 11/2004 | Poeppelman | H03M 13/35 714/785 |
| 7,093,183 B2 | * | 8/2006 | Chen | H03M 13/134 714/785 |
| 7,278,085 B1 | * | 10/2007 | Weng | G06F 11/1008 714/766 |

(Continued)

*Primary Examiner* — John J Tabone, Jr.
(74) *Attorney, Agent, or Firm* — Jackson Walker L.L.P.

(57) ABSTRACT

An error correction code for an array of N words of M bits each may be generated by: (i) for each word of the N words, computing a respective set of checkbits for single-error correction of such word; (ii) computing a set of bit-position-related checkbits comprising a bitwise logical exclusive OR of all of the sets of checkbits for single-error correction of the N words; (iii) for each word of the N words, computing a respective parity for the respective set of checkbits and the word itself in order to form a vector of N parity bits; (iv) computing a set of word-related checkbits for single-error correction of the vector of N parity bits; and (v) computing a cumulative parity bit comprising a parity calculation of the set of bit-position-related checkbits, the set of word-related checkbits, and the vector of N parity bits.

15 Claims, 4 Drawing Sheets

(56) References Cited

U.S. PATENT DOCUMENTS

| | | | | |
|---|---|---|---|---|
| 7,398,449 B1* | 7/2008 | Normoyle | G06F 11/1016 | 714/767 |
| 7,447,948 B2* | 11/2008 | Galbi | G06F 11/1032 | 714/2 |
| 8,321,769 B1* | 11/2012 | Yeo | H03M 13/2918 | 714/785 |
| 8,694,862 B2* | 4/2014 | Sazeides | G06F 11/1008 | 714/703 |
| 8,990,660 B2* | 3/2015 | Moyer | G06F 11/1076 | 711/100 |
| 2003/0079172 A1* | 4/2003 | Yamagishi | H03M 13/118 | 714/781 |
| 2006/0236211 A1* | 10/2006 | Shieh | H03M 13/09 | 714/781 |
| 2007/0283207 A1* | 12/2007 | Dell | H03M 13/098 | 714/752 |
| 2007/0283208 A1* | 12/2007 | Dell | H03M 13/098 | 714/752 |
| 2007/0283223 A1* | 12/2007 | Dell | G06F 11/10 | 714/768 |
| 2008/0109704 A1* | 5/2008 | Christenson | G06F 11/1048 | 714/766 |
| 2008/0109707 A1* | 5/2008 | Dell | H03M 13/03 | 714/776 |
| 2008/0162991 A1* | 7/2008 | Dell | G06F 11/1012 | 714/25 |
| 2010/0223525 A1* | 9/2010 | Wuu | G06F 11/1064 | 714/755 |
| 2012/0066567 A1* | 3/2012 | Moyer | G06F 11/1048 | 714/763 |
| 2013/0031447 A1* | 1/2013 | Sharon | H03M 13/1128 | 714/785 |
| 2013/0305127 A1* | 11/2013 | Kim | H04L 1/0057 | 714/785 |
| 2013/0346798 A1* | 12/2013 | Moyer | G06F 11/1008 | 714/27 |
| 2015/0089325 A1* | 3/2015 | Chandrasekhar | G06F 11/1072 | 714/766 |
| 2015/0098263 A1* | 4/2015 | Hirayama | G11C 11/221 | 365/145 |
| 2015/0301890 A1* | 10/2015 | Marshall | G06F 11/1048 | 714/764 |
| 2017/0005672 A1* | 1/2017 | Hughes, Jr. | H03M 13/1575 | |
| 2017/0257120 A1* | 9/2017 | Kern | G06F 11/1076 | |

* cited by examiner

DETECTION OF DOUBLE BIT ERRORS AND CORRECTION OF SINGLE BIT ERRORS IN A MULTIWORD ARRAY

RELATED APPLICATION

The present disclosure claims priority to U.S. Provisional Patent Application Ser. No. 62/518,156, filed Jun. 12, 2017, which is incorporated by reference herein in its entirety.

FIELD OF DISCLOSURE

The present disclosure relates in general to electronic devices with memories, (e.g., computing devices, mobile devices, game controllers, instrument panels, etc.), and more particularly, systems and methods for detection of double bit errors and correction of single-bit errors in a multiword array of a memory.

BACKGROUND

Computing devices often employ memory devices including one-time programmable (OTP) memories, which may allow, for example, for firmware or data to be corrected on the computing device post-production. However, OTP memories may be susceptible to bit errors in which one or more bits of the OTP memory "flips" from its correct value to an incorrect value. If left undetected, a bit error may lead to incorrect configuration data being applied to a computing device or an incorrect firmware patch being applied to the computing device, potentially rendering it non-functional.

To provide tolerance against bit errors, computing systems and memories often employ error correction codes to add tolerance to such bit errors, including the correction of single bit errors and the detection of double bit errors. However, as applied to large arrays of data, traditional approaches to generating error correction codes for single bit correction and detection of double bit errors have disadvantages. For example, one traditional approach may be to, for each M-bit word of an N-word array, calculate an error correction code for such word. However, such approach may require a large number of error correction code checkbits. To illustrate, for an array of 16,384 32-bit words, each word would require seven checkbits for single error correction and double error detection, thus requiring 114,688 checkbits for the entire 16,384-word array.

As another example, another traditional approach might be to consider an entire large array of data as an input to an error correction code engine. While this approach may minimize storage overhead for the calculated error correction code (e.g., a 21-bit error correction code for an array of 16,384 32-bit words), it would require an error correction code computation to be performed on all bits of the array at once, which may not be feasible. Also, such approach is not easily scalable to arbitrary arrays of N words of M bits each, especially where N and M are not known ahead of time.

SUMMARY

In accordance with the teachings of the present disclosure, the disadvantages and problems associated with existing approaches to detecting and correcting bit errors in a computing device may be reduced or eliminated.

In accordance with embodiments of the present disclosure, a system may include memory media and an error correction code engine configured to, responsive to storing to the memory media an array of N words each of M bits in length, generate an error correction code for the N words. The engine may generate the error correction code by: (i) for each word of the N words, computing a respective set of checkbits for single-error correction of such word; (ii) computing a set of bit-position-related checkbits comprising a bitwise logical exclusive OR of all of the sets of checkbits for single-error correction of the N words; (iii) for each word of the N words, computing a respective parity for the respective set of checkbits and the word itself in order to form a vector of N parity bits; (iv) computing a set of word-related checkbits for single-error correction of the vector of N parity bits; (v) computing a cumulative parity bit comprising a parity calculation of the set of bit-position-related checkbits, the set of word-related checkbits, and the vector of N parity bits; and (vi) storing the cumulative parity bit, the set of word-related checkbits, and the set of bit-position-related checkbits as the error correction code.

In accordance with these and other embodiments of the present disclosure, a method may include, responsive to storing to memory media an array of N words each of M bits in length, generating an error correction code for the N words by: (i) for each word of the N words, computing a respective set of checkbits for single-error correction of such word; (ii) computing a set of bit-position-related checkbits comprising a bitwise logical exclusive OR of all of the sets of checkbits for single-error correction of the N words; (iii) for each word of the N words, computing a respective parity for the respective set of checkbits and the word itself in order to form a vector of N parity bits; (iv) computing a set of word-related checkbits for single-error correction of the vector of N parity bits; (v) computing a cumulative parity bit comprising a parity calculation of the set of bit-position-related checkbits, the set of word-related checkbits, and the vector of N parity bits; and (vi) storing the cumulative parity bit, the set of word-related checkbits, and the set of bit-position-related checkbits as the error correction code.

In accordance with these and other embodiments of the present disclosure, an article of manufacture may include a non-transitory computer-readable medium and computer-executable instructions carried on the computer-readable medium, the instructions readable by a processor, the instructions, when read and executed, for causing the processor to, responsive to storing to memory media an array of N words each of M bits in length, generate an error correction code for the N words by: (i) for each word of the N words, computing a respective set of checkbits for single-error correction of such word; (ii) computing a set of bit-position-related checkbits comprising a bitwise logical exclusive OR of all of the sets of checkbits for single-error correction of the N words; (iii) for each word of the N words, computing a respective parity for the respective set of checkbits and the word itself in order to form a vector of N parity bits; (iv) computing a set of word-related checkbits for single-error correction of the vector of N parity bits; (v) computing a cumulative parity bit comprising a parity calculation of the set of bit-position-related checkbits, the set of word-related checkbits, and the vector of N parity bits; and (vi) storing the cumulative parity bit, the set of word-related checkbits, and the set of bit-position-related checkbits as the error correction code.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
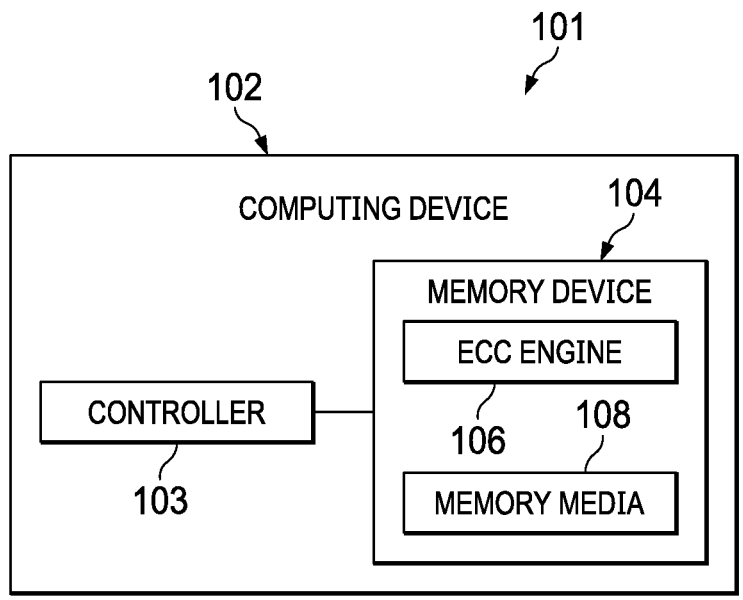
FIG. 1 illustrates a block diagram of selected components of an example computing device, in accordance with embodiments of the present disclosure.

FIG. 1 illustrates a block diagram of selected components of an example computing device 102, in accordance with embodiments of the present disclosure. As shown in FIG. 1, computing device 102 may comprise an enclosure 101, a controller 103, and a memory device 104.

Enclosure 101 may comprise any suitable housing, casing, or other enclosure for housing the various components of computing device 102. Enclosure 101 may be constructed from plastic, metal, and/or any other suitable materials. In addition, enclosure 101 may be adapted (e.g., sized and shaped) such that computing device 102 is readily transported on a person of a user of computing device 102. Accordingly, computing device 102 may include but is not limited to a smart phone, a tablet computing device, a handheld computing device, a personal digital assistant, a notebook computer, a video game controller, a desktop computer, or any other suitable device.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory device 104 and/or other computer-readable media accessible to controller 103.

Memory device 104 may be housed within enclosure 101, may be communicatively coupled to controller 103, and may include any system, device, or apparatus configured to retain program instructions and/or data for a period of time (e.g., computer-readable media). Memory device 104 may include one or more of random access memory (RAM), electrically erasable programmable read-only memory (EEPROM), a one-time programmable (OTP) memory, a Personal Computer Memory Card International Association (PCMCIA) card, flash memory, magnetic storage, opto-magnetic storage, or any suitable selection and/or array of volatile or non-volatile memory that retains data after power to computing device 102 is turned off.

As shown in FIG. 1, memory device 104 may comprise an error correction code (ECC) engine 106 and memory media 108. ECC engine 106 may comprise any suitable system, device, or apparatus for generating error correction codes and performing bit error detection and bit error correction for data stored in memory media 108 as further described herein. ECC engine 106 may be embodied in hardware, firmware, software, or any combination thereof. In some embodiments, ECC engine 106 may be an embedded component of memory device 104 configured to perform ECC operations as data is written to and/or read from memory device 104. In other embodiments, ECC engine 106 may comprise a program of instructions that may be read and executed by controller 103 or a special-purpose controller integral to memory device 104. In yet other embodiments, ECC engine 106 may be integral to memory media 108.

Memory media 108 may comprise any suitable collection of memory bit cells for storing data and ECC metadata associated with stored data, as described in greater detail below. For example, memory media 108 may be configured to store a maximum of N words (e.g., 16,384 words), each word having a maximum bit width of M bits (e.g., 32 bits), and ECC metadata associated with the array of N words of M bits each.

Although specific example components are depicted above in FIG. 1 as being integral to computing device 102 (e.g., controller 103, memory 104), a computing device 102 in accordance with this disclosure may comprise one or more components not specifically enumerated above. For example, computing device 102 may include one or more user interface components, including but not limited to a keypad, a touch screen, monitor, keyboard, audio speakers, a microphone, and/or a display device, thus allowing a user to interact with and/or otherwise manipulate computing device 102 and its associated components. As another example, computing device 102 may include one or more network interfaces for receiving and/or transmitting wireless and/or wireline transmissions.

Figure 2:
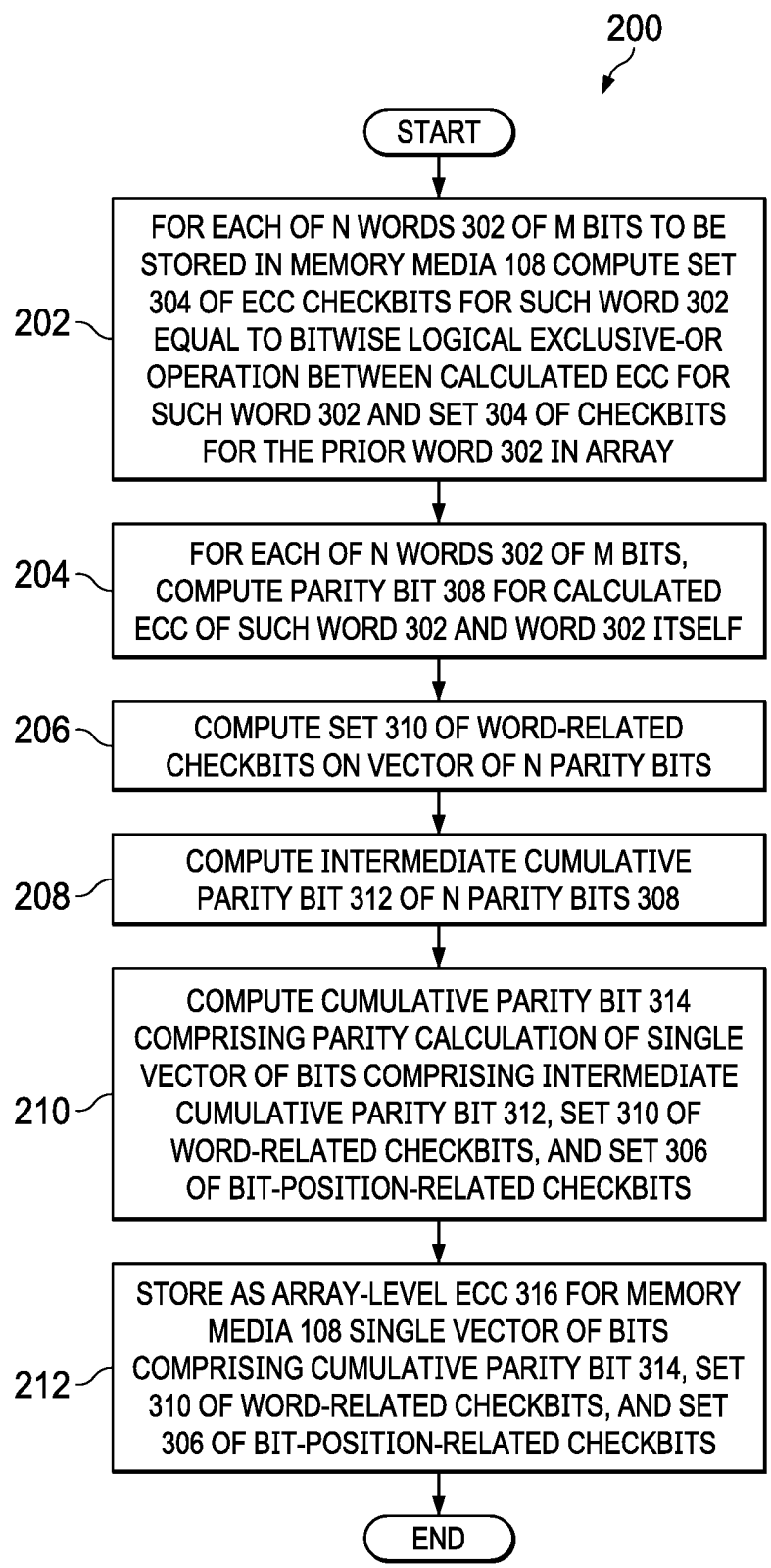
FIG. 2 illustrates a flow chart of an example method for generating an error correction code for a memory array, in accordance with certain embodiments of the present disclosure.
Figure 3:
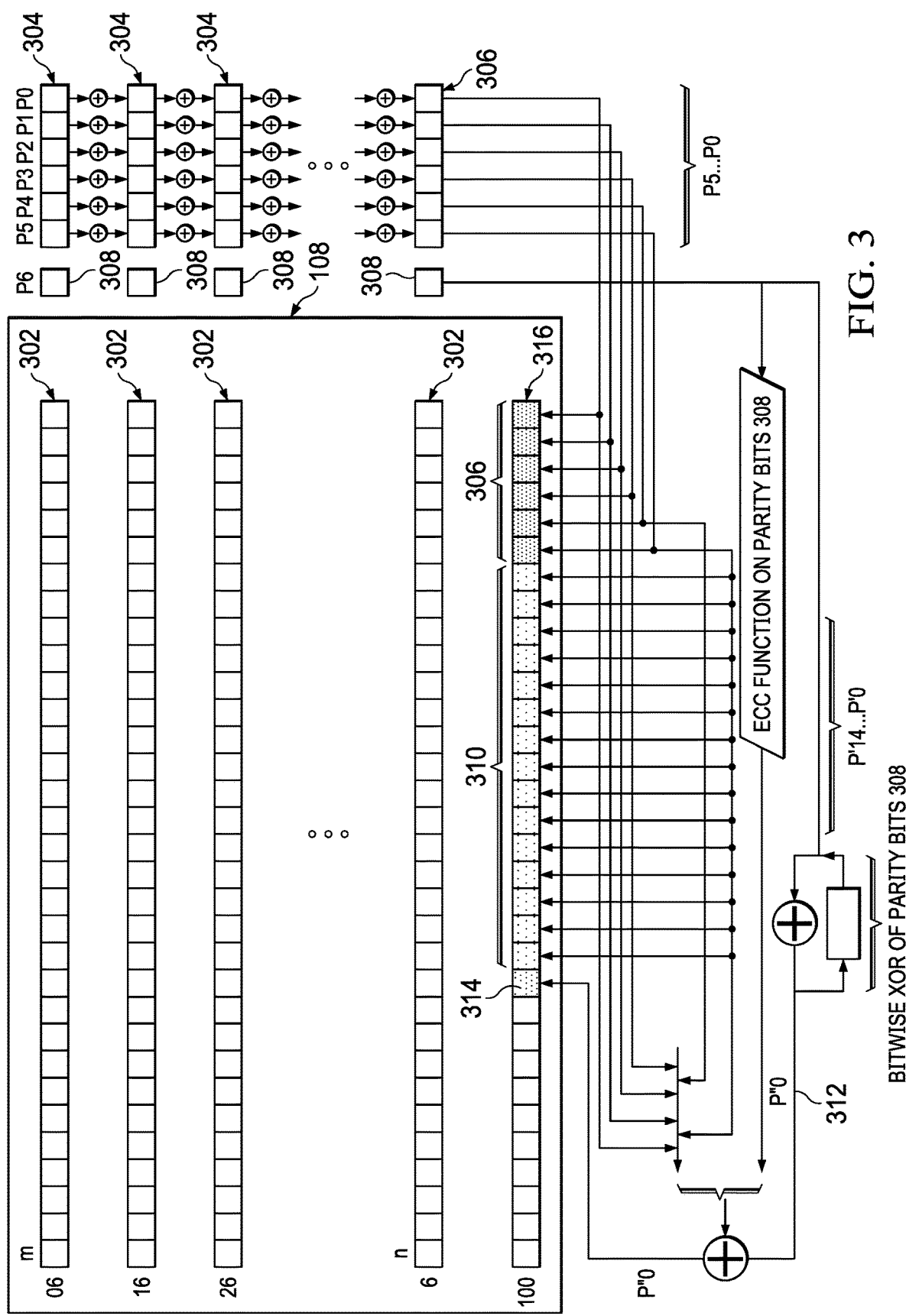
FIG. 3 illustrates portions of memory media and operations performed by an error correction code engine to generate an error correction code, in accordance with embodiments of the present disclosure.

FIG. 2 illustrates a flow chart of an example method 200 for generating an ECC for a memory array, in accordance with certain embodiments of the present disclosure. According to some embodiments, method 200 may begin at step 202. As noted above, teachings of the present disclosure may be implemented in a variety of configurations of computing device 102. Portions of the description of method 200 may make reference to FIG. 3. FIG. 3 illustrates portions of memory media 108 and operations performed by ECC engine 106 to generate the ECC, in accordance with embodiments of the present disclosure.

At step 202, for each of N words 302 of M bits to be stored in memory media 108, ECC engine 106 may compute a set 304 of ECC checkbits for such word 302, each set 304 of checkbits equal to a bitwise logical exclusive-OR operation between a calculated single-error correction ECC for such word 302 and the set 304 of checkbits for the prior word 302 in the array of words 302, with the exception that the set of checkbits for the first word 302 in the array may be equal to an error correction code for such first word 302. Calculation of an error correction code in step 202 may comprise any suitable manner of calculating an error correction code for a word 302, including without limitation generation of a Hamming code for single-error correction and double-error detection (SEC-DED), as is known in the art. After this step has been performed for each of the N words, a set 306 of bit-position-related checkbits may result, which may represent a cumulative bit position ECC for the N words 302 to be stored. For purposes of clarity and exposition, sets 304 of checkbits and set 306 of checkbits are shown in FIG. 3 as being six bits in length (e.g., $P_5 \ldots P_0$), as may be the case if M were equal to 32. However, sets 304 and set 306 of checkbits may be of any suitable bit length in accordance with the bit width M of words 302.

At step 204, for each of N words 302 of M bits, ECC engine 106 may compute a parity bit 308 for the calculated ECC of such word 302 based on a calculated parity for the set 304 of checkbits for such word and the word itself. At step 206, ECC engine 106 may compute a set 310 of word-related checkbits on the vector of N parity bits, which may represent a word position ECC for the N words 302 to be stored. Calculation of set 310 of word-related checkbits in step 206 may comprise any suitable manner of calculating an error correction code for the vector of N parity bits, including without limitation generation of a Hamming code for single-error correction and double-error detection (SEC-DED), as is known in the art. For purposes of clarity and exposition, set 310 of word-related checkbits is shown in FIG. 3 as being 15 bits in length (e.g., $P'_{14} \ldots P'_0$), as may be the case if N were equal to 16,384. However, set 310 of word-related checkbits may be of any suitable bit length in accordance with the number N of words 302.

At step 208, ECC engine 106 may compute an intermediate cumulative parity bit 312 (e.g., $P''_0$) of the N parity bits 308 calculated at step 204, which may be calculated as a logical exclusive OR of the N parity bits 308. At step 210, ECC engine 106 may compute a cumulative parity bit 314 (e.g., $P'''_0$), which may comprise a parity calculation (e.g., logical exclusive OR) of a single vector of bits comprising the intermediate cumulative parity bit 312, set 310 of word-related checkbits, and set 306 of bit-position-related checkbits.

At step 212, ECC engine 106 may store as an array-level ECC 316 for memory media 108 the single vector of bits comprising cumulative parity bit 314, set 310 of word-related checkbits, and set 306 of bit-position-related checkbits (e.g., the vector $P'''_0, P'_{14} \ldots P'_0, P_5 \ldots P_0$). After completion of step 212, method 200 may end. Notably, ECC engine 106 need not permanently store sets 304 of checkbits and parity bits 308, but may only need to temporarily store such sets 304 of checkbits and parity bits 308 long enough to calculate array-level ECC 316.

Although FIG. 2 discloses a particular number of steps to be taken with respect to method 200, method 200 may be executed with greater or lesser steps than those depicted in FIG. 2. In addition, although FIG. 2 discloses a certain order of steps to be taken with respect to method 200, the steps comprising method 200 may be completed in any suitable order. In some embodiments, portions of some steps of method 200 may execute contemporaneously with portions of other steps of method 200 (e.g., portions of steps 202-210 may execute at the same time).

Method 200 may be implemented using computing system 102 or any other system operable to implement method 200. In certain embodiments, method 200 may be implemented partially or fully in software and/or firmware embodied in computer-readable media.

Figure 4:
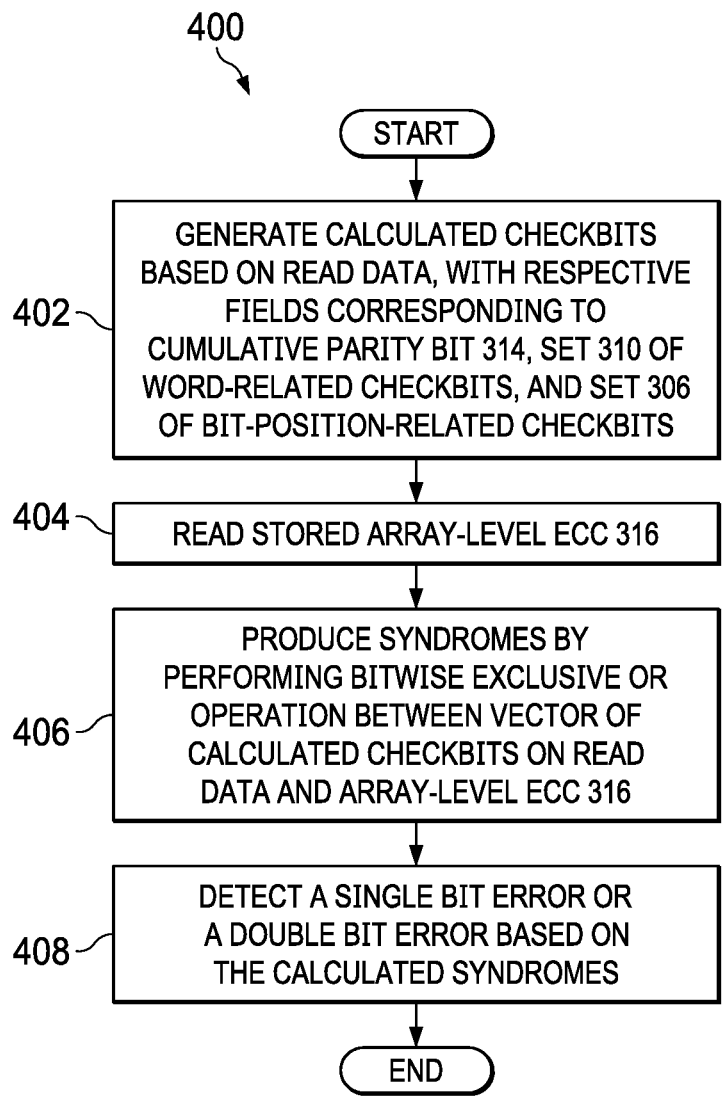
FIG. 4 illustrates a flow chart of an example method for detecting bit errors in a memory array, in accordance with certain embodiments of the present disclosure.

FIG. 4 illustrates a flow chart of an example method 400 for detecting bit errors (e.g., single bit errors or double bit errors) in memory media 108, in accordance with certain embodiments of the present disclosure. According to some embodiments, method 400 may begin at step 402. As noted above, teachings of the present disclosure may be implemented in a variety of configurations of computing system 102.

At step 402, in response to data being read from memory media 108, ECC engine 106 may, using the same approach set forth in method 200, generate calculated checkbits based on read data, with respective fields corresponding to cumulative parity bit 314, set 310 of word-related checkbits, and set 306 of bit-position-related checkbits. For example, the calculated checkbits based on read data may be a vector $C'''_0, C'_{14} \ldots C'_0, C_5 \ldots C_0$ with fields $C'''_0, C'_{14} \ldots C'_0$, and $C_5 \ldots C_0$ corresponding to fields $P'''_0, P'_{14} \ldots P'_0$, and $P_5 \ldots P_0$ of array-level ECC 316. At step 404, ECC engine 106 may read stored array-level ECC 316 (e.g., stored checkbits $P'''_0, P'_{14} \ldots P'_0$, and $P_5 \ldots P_0$).

At step 406, ECC engine 106 may perform a bitwise exclusive OR operation between the vector of calculated checkbits based on read data and array-level ECC 316 to produce syndromes including a cumulative parity bit syndrome corresponding to cumulative parity bit 314 (e.g., $S'''_0 = C'''_0 \oplus P'''_0$), a word-related checkbit syndrome corresponding to set 310 of word-related checkbits (e.g., $S'_{14} \ldots S'_0 = C'_{14} \ldots C'_0 \oplus P'_{14} \ldots P'_0$), and a bit-position-related checkbit syndrome corresponding to set 306 of bit-position-related checkbits (e.g., $S_5 \ldots S_0 = C_5 \ldots C_0 \oplus P_5 \ldots P_0$).

At step 408, ECC engine 106 may detect a single bit error or a double bit error based on the calculated syndromes. For example, in some embodiments, ECC engine 106 may detect a single bit error or a double bit error in accordance with the following table (wherein "DED" indicates detection of a double-bit error and "SEC" indicates detection of a single-bit error):

| $S'''_0$ | $S'_{14} \ldots S'_0$ | $S_5 \ldots S_0$ | Result |
|---|---|---|---|
| 0 | 0 | 0 | No Errors |
| 0 | 0 | non-zero | DED |
| 0 | non-zero | 0 | DED |
| 0 | non-zero | non-zero | DED |
| 1 | 0 | 0 | SEC (error in $S'''_0$) |
| 1 | 0 | non-zero | SEC (error in $S_5 \ldots S_0$) |
| 1 | non-zero | 0 | SEC (error in $S'_{14} \ldots S'_0$) |
| 1 | non-zero | non-zero | SEC (error in data) |

After completion of step 408, method 400 may end.

Although FIG. 4 discloses a particular number of steps to be taken with respect to method 400, method 400 may be executed with greater or lesser steps than those depicted in FIG. 4. In addition, although FIG. 4 discloses a certain order of steps to be taken with respect to method 400, the steps comprising method 400 may be completed in any suitable order.

Method 400 may be implemented using computing system 102 or any other system operable to implement method 400. In certain embodiments, method 400 may be implemented partially or fully in software and/or firmware embodied in computer-readable media.

Figure 5:
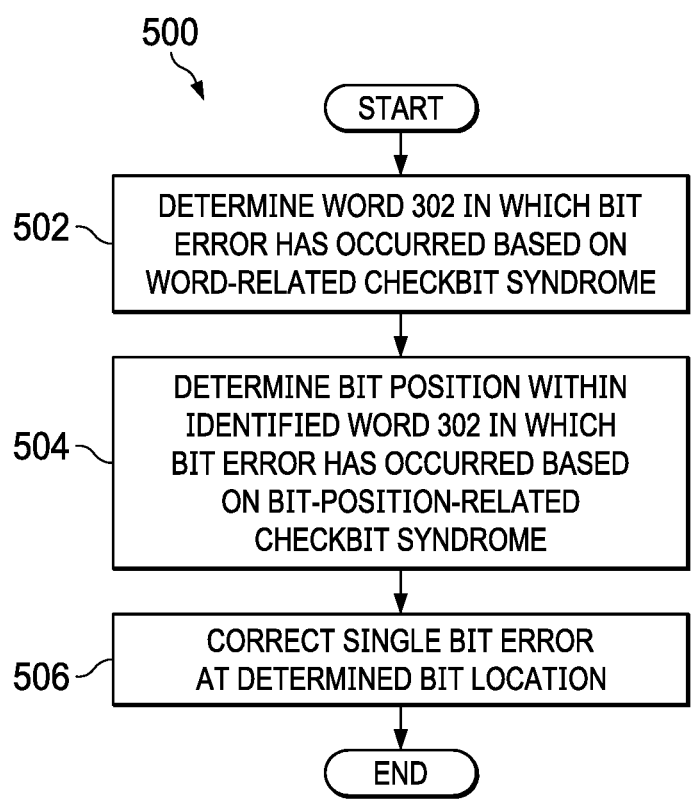
FIG. 5 illustrates a flow chart of an example method for correcting bit errors in memory media, in accordance with certain embodiments of the present disclosure.

FIG. 5 illustrates a flow chart of an example method 500 for correcting bit errors (e.g., single bit errors) in memory media 108, in accordance with certain embodiments of the present disclosure. According to some embodiments, method 500 may begin at step 502. As noted above, teachings of the present disclosure may be implemented in a variety of configurations of computing system 102.

At step 502, responsive to detecting a single bit error in accordance with method 400 above, ECC engine 106 may determine a word 302 in which a bit error has occurred based on the word-related checkbit syndrome (e.g., $S'_{14} \ldots S'_0$). At step 504, ECC engine 106 may determine a bit position within the identified word 302 in which a bit error has occurred based on the bit-position-related checkbit syndrome (e.g., $S_5 \ldots S_0$). For example, in some embodiments, ECC engine 106 may determine the bit-position of a single bit error in accordance with the following table:

| $S_5 \ldots S_0$ | Result |
|---|---|
| 000000 | No Error |
| 011111 | Error in bit position 0 |
| 100001 | Error in bit position 1 |
| 100010 | Error in bit position 2 |
| . | . |
| . | . |
| . | . |
| 111110 | Error in bit position 30 |
| 111111 | Error in bit position 31 |
| 000001 | Error in $P_0$ |
| 000010 | Error in $P_1$ |
| 000100 | Error in $P_2$ |
| 001000 | Error in $P_3$ |
| 010000 | Error in $P_4$ |
| 100000 | Error in $P_5$ |

At step 506, ECC engine 106 may correct the single bit error at the location determined from steps 502 and 504 above. Accordingly, together the word-related checkbit syndrome and the bit-position-related checkbit syndrome function as a correction mask for single-bit errors. After completion of step 506, method 500 may end.

Although FIG. 5 discloses a particular number of steps to be taken with respect to method 500, method 500 may be executed with greater or lesser steps than those depicted in FIG. 5. In addition, although FIG. 5 discloses a certain order of steps to be taken with respect to method 500, the steps comprising method 500 may be completed in any suitable order.

Method 500 may be implemented using computing system 102 or any other system operable to implement method 500. In certain embodiments, method 500 may be implemented partially or fully in software and/or firmware embodied in computer-readable media.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A system comprising:
   memory media; and
   an error correction code engine configured to, responsive to storing to the memory media an array of N words each of M bits in length, generate an error correction code for the N words by:
   for each word of the N words, computing a respective set of checkbits for single-error correction of such word;
   computing a set of bit-position-related checkbits comprising a bitwise logical exclusive OR of all of the sets of checkbits for single-error correction of the N words;
   for each word of the N words, computing a respective parity for the respective set of checkbits and the word itself in order to form a vector of N parity bits;
   computing a set of word-related checkbits for single-error correction of the vector of N parity bits;
   computing a cumulative parity bit comprising a parity calculation of the set of bit-position-related checkbits, the set of word-related checkbits, and the vector of N parity bits; and
   storing the cumulative parity bit, the set of word-related checkbits, and the set of bit-position-related checkbits as the error correction code.

2. The system of claim 1, wherein the error correction code engine is further configured to, responsive to reading data from the memory media:
   generate a calculated checkbits vector based on data read from the memory media in a manner substantially similar to generation of the error correction code for the N words;
   generate syndromes by performing a bitwise logical XOR operation between the error correction code and the calculated checkbits vector; and
   determine whether zero, one, or two bit errors occurred in the data read from the memory media based on the syndromes.

3. The system of claim 2, wherein the error correction code engine is further configured to, responsive to determining that one bit error occurred in the data read from the memory media, determine a location of the bit error within the array based on the syndromes.

4. The system of claim 3, wherein determining the location of the bit error within the array comprises:
   determining which of the N words includes the bit error based on a word-related checkbit syndrome generated from a bitwise logical XOR operation between a portion of the error correction code corresponding to the set of word-related checkbits and a portion of the calculated checkbits vector corresponding to the set of word-related checkbits; and
   determining which of the M bits includes the bit error based on a bit-position-related checkbit syndrome generated from a bitwise logical XOR operation between a portion of the error correction code corresponding to the set of bit-position-related checkbits and a portion of the calculated checkbits vector corresponding to the set of bit-position-related checkbits.

5. The system of claim 4, wherein the error correction code engine is further configured to correct the bit error based on the location.

6. A method comprising, responsive to storing to memory media an array of N words each of M bits in length, generating an error correction code for the N words by:
  for each word of the N words, computing a respective set of checkbits for single-error correction of such word;
  computing a set of bit-position-related checkbits comprising a bitwise logical exclusive OR of all of the sets of checkbits for single-error correction of the N words;
  for each word of the N words, computing a respective parity for the respective set of checkbits and the word itself in order to form a vector of N parity bits;
  computing a set of word-related checkbits for single-error correction of the vector of N parity bits;
  computing a cumulative parity bit comprising a parity calculation of the set of bit-position-related checkbits, the set of word-related checkbits, and the vector of N parity bits; and
  storing the cumulative parity bit, the set of word-related checkbits, and the set of bit-position-related checkbits as the error correction code.

7. The method of claim 6, further comprising, responsive to reading data from the memory media:
  generating a calculated checkbits vector based on data read from the memory media in a manner substantially similar to generation of the error correction code for the N words;
  generating syndromes by performing a bitwise logical XOR operation between the error correction code and the calculated checkbits vector; and
  determining whether zero, one, or two bit errors occurred in the data read from the memory media based on the syndromes.

8. The method of claim 7, further comprising, responsive to determining that one bit error occurred in the data read from the memory media, determining a location of the bit error within the array based on the syndromes.

9. The method of claim 8, wherein determining the location of the bit error within the array comprises:
  determining which of the N words includes the bit error based on a word-related checkbit syndrome generated from a bitwise logical XOR operation between a portion of the error correction code corresponding to the set of word-related checkbits and a portion of the calculated checkbits vector corresponding to the set of word-related checkbits; and
  determining which of the M bits includes the bit error based on a bit-position-related checkbit syndrome generated from a bitwise logical XOR operation between a portion of the error correction code corresponding to the set of bit-position-related checkbits and a portion of the calculated checkbits vector corresponding to the set of bit-position-related checkbits.

10. The method of claim 9, further comprising correcting the bit error based on the location.

11. An article of manufacture comprising:
  a non-transitory computer-readable medium; and
  computer-executable instructions carried on the computer-readable medium, the instructions readable by a processor, the instructions, when read and executed, for causing the processor to, responsive to storing to memory media an array of N words each of M bits in length, generate an error correction code for the N words by:
    for each word of the N words, computing a respective set of checkbits for single-error correction of such word;
    computing a set of bit-position-related checkbits comprising a bitwise logical exclusive OR of all of the sets of checkbits for single-error correction of the N words;
    for each word of the N words, computing a respective parity for the respective set of checkbits and the word itself in order to form a vector of N parity bits;
    computing a set of word-related checkbits for single-error correction of the vector of N parity bits;
    computing a cumulative parity bit comprising a parity calculation of the set of bit-position-related checkbits, the set of word-related checkbits, and the vector of N parity bits; and
    storing the cumulative parity bit, the set of word-related checkbits, and the set of bit-position-related checkbits as the error correction code.

12. The article of claim 11, the instructions for further causing the processor to, responsive to reading data from the memory media:
  generate a calculated checkbits vector based on data read from the memory media in a manner substantially similar to generation of the error correction code for the N words;
  generate syndromes by performing a bitwise logical XOR operation between the error correction code and the calculated checkbits vector; and
  determine whether zero, one, or two bit errors occurred in the data read from the memory media based on the syndromes.

13. The article of claim 12, the instructions for further causing the processor to, responsive to determining that one bit error occurred in the data read from the memory media, determine a location of the bit error within the array based on the syndromes.

14. The article of claim 13, wherein determining the location of the bit error within the array comprises:
  determining which of the N words includes the bit error based on a word-related checkbit syndrome generated from a bitwise logical XOR operation between a portion of the error correction code corresponding to the set of word-related checkbits and a portion of the calculated checkbits vector corresponding to the set of word-related checkbits; and
  determining which of the M bits includes the bit error based on a bit-position-related checkbit syndrome generated from a bitwise logical XOR operation between a portion of the error correction code corresponding to the set of bit-position-related checkbits and a portion of the calculated checkbits vector corresponding to the set of bit-position-related checkbits.

15. The article of claim 14, the instructions for further causing the processor to correct the bit error based on the location.

* * * * *